(12) United States Patent
Tajika

(10) Patent No.: US 7,626,266 B2
(45) Date of Patent: Dec. 1, 2009

(54) SEMICONDUCTOR INTEGRATED CIRCUIT DEVICE HAVING A PLURALITY OF FUNCTIONAL CIRCUITS WITH LOW POWER CONSUMPTION

(75) Inventor: Kenichi Tajika, Kyoto (JP)

(73) Assignee: Panasonic Corporation, Osaka (JP)

( * ) Notice: Subject to any disclaimer, the term of this patent is extended or adjusted under 35 U.S.C. 154(b) by 357 days.

(21) Appl. No.: 11/475,184

(22) Filed: Jun. 27, 2006

(65) Prior Publication Data
US 2007/0007642 A1 Jan. 11, 2007

(30) Foreign Application Priority Data
Jul. 4, 2005 (JP) .............................. 2005-194879

(51) Int. Cl.
*H01L 23/52* (2006.01)
*H01L 23/02* (2006.01)
*H03K 5/15* (2006.01)

(52) U.S. Cl. .............................. 257/758; 257/E23.145; 257/E23.153; 257/691; 257/211; 257/208; 257/48; 257/700; 257/701; 257/723; 713/600; 713/400; 713/500

(58) Field of Classification Search .......... 257/691.758, 257/E23.145, E23.153, 211, 208, 48, 700, 257/701; 713/600, 400, 500
See application file for complete search history.

(56) References Cited

U.S. PATENT DOCUMENTS

| 6,026,498 | A | * | 2/2000 | Fuse et al. ................... 713/600 |
| 6,711,690 | B2 | * | 3/2004 | Dayan et al. ................... 726/34 |
| 2003/0056070 | A1 | * | 3/2003 | Dayan et al. ................. 711/163 |
| 2005/0192787 | A1 | * | 9/2005 | Kuwahara et al. .............. 703/18 |

FOREIGN PATENT DOCUMENTS

JP 2003-132683 5/2003

* cited by examiner

*Primary Examiner*—Alexander O Williams
(74) *Attorney, Agent, or Firm*—McDermott Will & Emery LLP

(57) ABSTRACT

A semiconductor integrated circuit device includes a functional circuit block, a power supply for supplying power to the functional circuit block, a power supply interruption circuit disposed between the functional circuit block and the power supply and including a plurality of switching elements, and a power supply interruption control circuit for individually driving the switching elements. The functional circuit block is formed by integrating functional circuits, such as a logic circuit and a memory circuit. The functional circuits are formed with power supply terminals, respectively, and the power supply terminals are electrically connected through power supply interconnects to the switching elements. The power supply interconnects have the same length.

2 Claims, 6 Drawing Sheets

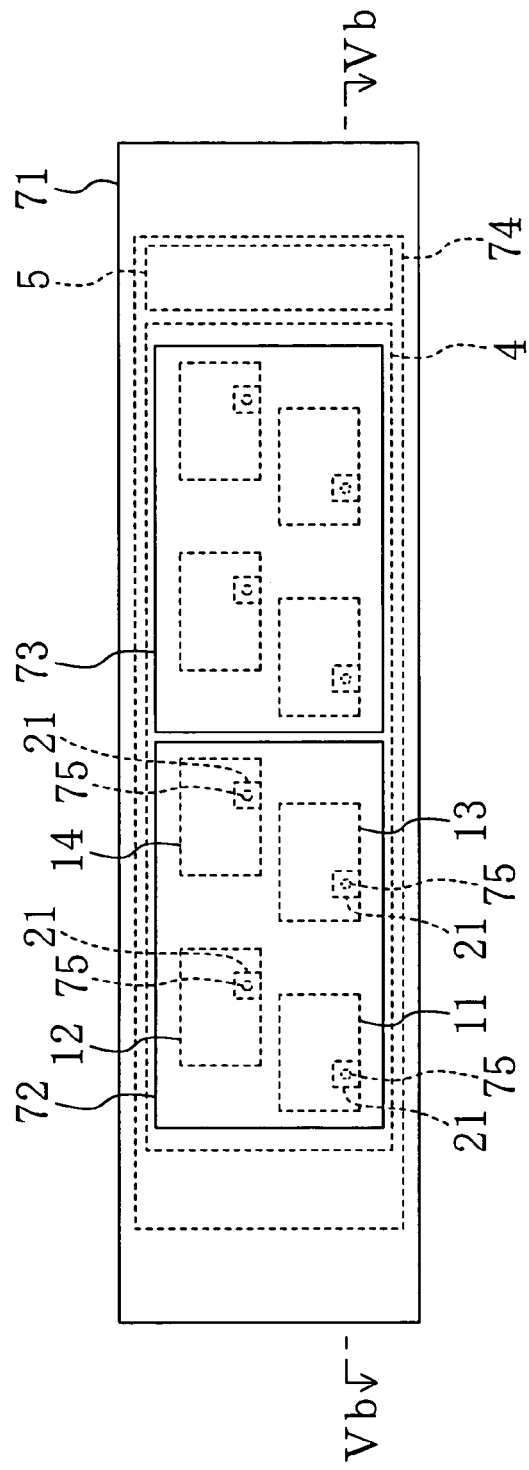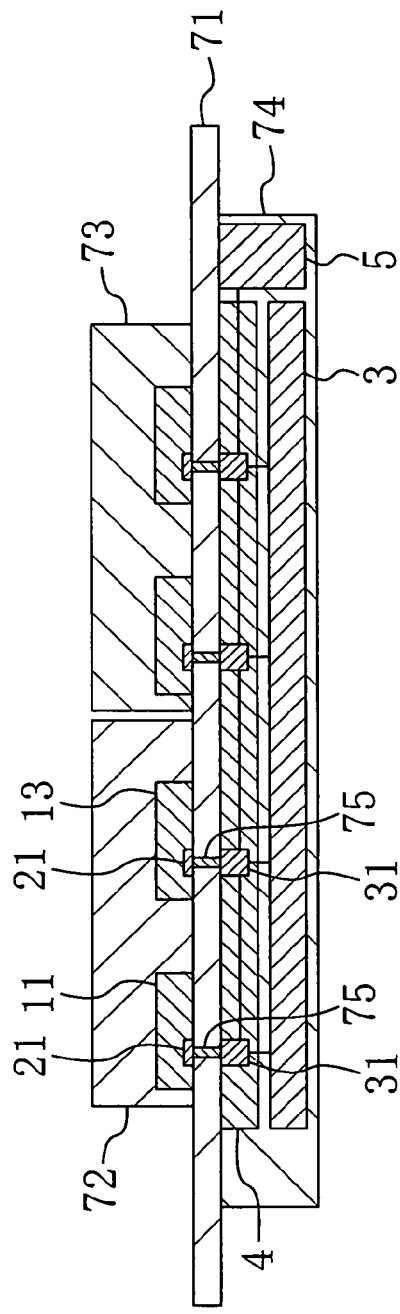
FIG. 5A
FIG. 5B

SEMICONDUCTOR INTEGRATED CIRCUIT DEVICE HAVING A PLURALITY OF FUNCTIONAL CIRCUITS WITH LOW POWER CONSUMPTION

CROSS-REFERENCE TO RELATED APPLICATIONS

The disclosure of Japanese Patent Application No. 2005-194879 filed on Jul. 4, 2005 including specification, drawings and claims is incorporated herein by reference in its entirety.

BACKGROUND OF THE INVENTION (1) Field of the Invention

The present invention relates to semiconductor integrated circuit devices, and more particularly relates to semiconductor integrated circuit devices in which memory circuits, logic circuits, and other circuits are combined together.

(2) Description of Related Art

In recent years, with an increase in the scale and degree of integration of semiconductor integrated circuit devices, circuit operations have been becoming more complicated. In particular, for products using chargers, such as cell phones, the time during which a battery can be used has been demanded to be increased. To respond to this demand, a clock gating technique has been suggested in which the power consumption of a semiconductor integrated circuit device is reduced in the following manner: When a functional circuit that operates in synchronization with a clock signal is not being used in the integrated circuit device during an operation of the integrated circuit device, the clock signal is prevented from being supplied to the functional circuit, thereby ceasing an operation of the functional circuit. The use of such a clock gating technique can suppress a redundant circuit operation. This can avoid a problem concerning power consumption.

However, as process rules of semiconductor integrated circuit devices become finer, the leakage current through transistors has been increasing. Also when a semiconductor integrated circuit device is not operating, redundant power is consumed due to the leakage current. This has become a serious problem.

To cope with this, in recent years, a power gating (power shutdown) technique has been suggested in which power is supplied to a plurality of related functional circuits formed in the semiconductor integrated circuit device in units of functional circuit blocks composed of the plurality of functional circuits or the power supply thereto is interrupted in units of the functional circuit blocks, thereby reducing the power consumed due to leakage current passing through some of the functional circuit blocks that are not in use.

Disclosed, for example, in Japanese Unexamined Patent Publication No. 2003-132683 are a semiconductor integrated circuit device in which power is supplied to functional circuits in units of functional circuit blocks obtained by integrating functional circuits, such as logic circuits and memory circuits, or the power supply thereto is interrupted in units of the functional circuit blocks, thereby reducing the power consumed due to leakage current, and a method for driving the same (power supply method).

According to the method, the power supply to circuits that are not being used in the semiconductor integrated circuit device can be interrupted in units of functional circuit blocks. This permits a reduction in redundant power consumed due to leakage current.

However, in a known semiconductor integrated circuit device and a known method for driving the same, power is shut off at only one point (power supply interruption element) between a power source and functional circuit blocks. Therefore, the power supply and power supply interruption can be executed only in units of the functional circuit blocks. All of functional circuits included in each functional circuit block are seldom used at the same time, and each of operating ones of the functional circuit blocks usually include functional circuits that are not in use. In view of the above, in the known semiconductor integrated circuit device in which the power supply and power supply interruption are executed in units of the functional circuit blocks, power is supplied also to some of the functional circuits that are not in use. This causes leakage current passing through the circuit.

In a case where functional circuits distributed in each of functional circuit blocks are formed with interconnects for supplying power to the associated functional circuits to control the power supply conditions for each functional circuit, a signal delay is caused due to the differences among interconnects in resistance and parasitic capacitance, and a voltage drop or any other problem is caused due to high interconnect resistance. For this reason, the power supply to the functional circuits and the interruption of the power supply cannot be efficiently executed simply by providing each interconnect with a point at which power can be shut off. For example, the time at which power is supplied to the functional circuits and the time at which the power supply thereto is interrupted vary among the functional circuits included in the functional circuit block, and the supply voltage varies thereamong.

SUMMARY OF THE INVENTION

The present invention is made to solve the known problems, and its object is to realize a semiconductor integrated circuit device that suppresses variations in the timings at which power is supplied to each of functional circuits and the power supply is interrupted and variations in the supply voltage and reduces, in units of the functional circuits, the power consumed due to leakage current.

In order to achieve the above-described object, a semiconductor integrated circuit device of the present invention is configured to include power supply interconnects provided in a one-to-one correspondence with functional circuits and having substantially the same length and switching elements for supplying power to the functional circuits and interrupting power supply thereto.

A semiconductor integrated circuit device according to a first aspect of the present invention includes: a plurality of functional circuits formed on a semiconductor chip and having power supply terminals, respectively; a power supply circuit for supplying power through the power supply terminals to the functional circuits; a power supply interruption circuit electrically connected between the power supply circuit and the power supply terminals and having a plurality of switching elements for supplying power to the functional circuits or interrupting power supply thereto; and a plurality of interconnects through which the power supply terminals are electrically connected to the switching elements, respectively, the plurality of interconnects having the same length.

Since the semiconductor integrated circuit device of the first aspect includes the plurality of interconnects through which the power supply terminals are electrically connected to the switching elements, respectively, and which have the same length, this hardly causes the differences among the interconnects in resistance and capacitance. In view of the above, power can be supplied to the functional circuits in units of the functional circuits and the power supply thereto can be interrupted in units of the functional circuits, resulting in reduced leakage current. In addition, the voltage supplied to each functional circuit and the timings at which power is supplied to the functional circuit and power supply thereto is interrupted can be restrained from varying among the functional circuits.

A semiconductor integrated circuit device according to a second aspect of the present invention includes: a plurality of functional circuits formed on a functional circuit region of a semiconductor chip and having power supply terminals, respectively; a power supply circuit for supplying power through the power supply terminals to the functional circuits; a power supply interruption circuit formed on a different region of the semiconductor chip from the functional circuit region thereof so as to be electrically connected between the power supply circuit and the power supply terminals and having a plurality of switching elements for supplying power to the functional circuits or interrupting power supply thereto; a plurality of power supply interconnect layers formed at different levels above the functional circuit region so as to be isolated from each other; a first contact plug through which each said power supply terminal is electrically connected to any one of the plurality of power supply interconnect layers; and a second contact plug through which each said switching element is electrically connected to any one of the plurality of power supply interconnect layers.

Since the semiconductor integrated circuit device of the second aspect includes the plurality of power supply interconnect layers formed at different levels above the functional circuit region so as to be isolated from one another, the resistance of each power supply interconnect layer can be significantly reduced. This hardly causes variations among the functional circuits in supply voltage. Therefore, power can be supplied to the functional circuits in units of the functional circuits and power supply thereto can be interrupted in units of the functional circuits. This can reduce the leakage current. Herein, the "functional circuit region" means a region of the semiconductor chip on which functional circuits are formed.

A semiconductor integrated circuit device according to a third aspect of the present invention includes: a first semiconductor chip formed with a first substrate and a plurality of functional circuits formed on the principal surface of the first substrate and having power supply terminals, respectively, a second semiconductor chip formed with a second substrate, a power supply circuit for supplying power through the power supply terminals to the plurality of functional circuits, and a power supply interruption circuit having a plurality of switching elements for supplying power to the functional circuits or interrupting power supply thereto, the switching elements being electrically connected between the power supply circuit and the power supply terminals, the power supply circuit and the power supply interruption circuit being formed on the principal surface of the second substrate, the second semiconductor chip being bonded to the first semiconductor chip; and at least either a plurality of first through-hole interconnects formed to pass through the first substrate or a plurality of second through-hole interconnects formed to pass through the second substrate, wherein the power supply terminals are electrically connected to the associated switching elements through at least the first through-hole interconnects or the second through-hole interconnects.

According to the semiconductor integrated circuit device of the third aspect, the first semiconductor chip formed with the functional circuits is bonded to the second semiconductor chip formed with the power supply interruption circuit, and the power supply terminals are electrically connected through the first through-hole interconnects or the second through-hole interconnects to the switching elements. This allows the interconnects through which the power supply terminals are electrically connected to the switching elements to have substantially the same length. Therefore, the differences among the interconnects in resistance and capacitance are reduced. This can restrain the voltage supplied to each functional circuit and the timings at which power is supplied to the functional circuit and the power supply thereto is interrupted from varying. Furthermore, the degree of integration can be improved.

It is preferable that in the semiconductor integrated circuit device of the third aspect, the second semiconductor chip is bonded to the first semiconductor chip with the opposite surface of the second substrate to the principal surface thereof opposed to the principal surface of the first substrate and the power supply terminals are electrically connected through the second through-hole interconnects to the switching elements.

It is preferable that in the semiconductor integrated circuit device of the third aspect, the first semiconductor chip is bonded to the second semiconductor chip with the opposite surface of the first substrate to the principal surface thereof opposed to the principal surface of the second substrate, and the power supply terminals are electrically connected through the first through-hole interconnects to the switching elements.

It is preferable that in the semiconductor integrated circuit device of the third aspect, the second semiconductor chip is bonded to the first semiconductor chip with the opposite surface of the second substrate to the principal surface thereof opposed to the opposite surface of the first substrate to the principal surface thereof and the power supply terminals are electrically connected through the first and second through-hole interconnects to the switching elements.

A semiconductor integrated circuit device according to a fourth aspect of the present invention includes a first semiconductor chip formed with a first substrate, a plurality of functional circuits formed on the principal surface of the first substrate and having power supply terminals, respectively, a first insulating film covering the functional circuits, and a plurality of first contact interconnects passing through the first insulating film and electrically connected to the power supply terminals, and a second semiconductor chip including a second substrate, a power supply circuit for supplying power through the power supply terminals to the plurality of functional circuits, a power supply interruption circuit having a plurality of switching elements for supplying power to the functional circuits or interrupting power supply thereto, the switching elements being electrically connected between the power supply circuit and the power supply terminals, the power supply circuit and the power supply interruption circuit being formed on the principal surface of the second substrate, a second insulating film covering the power supply circuit and the power supply interruption circuit, and a plurality of second contact interconnects passing through the second insulating film and electrically connected to the switching elements, the principal surface of the second semiconductor chip being bonded to that of the first semiconductor chip, wherein the power supply terminals are electrically connected through the first and second contact interconnects to the switching elements.

The semiconductor integrated circuit device of the fourth aspect includes the second semiconductor chip whose principal surface is bonded to the principal surface of the first semiconductor chip, and the power supply terminals are electrically connected through the first contact interconnects and the second contact interconnects to the switching elements. This allows the interconnects through which the power supply terminals are electrically connected to the switching elements to have substantially the same length. Therefore, the differences among the interconnects in resistance and capacitance are reduced. This can restrain the voltage supplied to each functional circuit and the timings at which power is supplied to the functional circuit and the power supply thereto is interrupted from varying. Furthermore, the degree of integration can be improved.

A semiconductor integrated circuit device according to a fifth aspect of the present invention includes: a packaging substrate; a first semiconductor chip adhered to one surface of the packaging substrate; and a second semiconductor chip adhered to the opposite surface of the packaging substrate to said one surface thereof, wherein the packaging substrate has a plurality of through holes passing through the packaging substrate, a plurality of functional circuits having power supply terminals, respectively, are formed on the principal surface of the first semiconductor chip, a power supply circuit for supplying power through the power supply terminals to the plurality of functional circuits and a power supply interruption circuit electrically connected between the power supply circuit and the power supply terminals and having a plurality of switching elements for supplying power to the functional circuits or interrupting power supply thereto are formed on the principal surface of the second semiconductor chip, and a plurality of through-hole interconnects through which the power supply terminals are electrically connected to the switching elements are formed to fill the through holes.

The semiconductor integrated circuit device of the fifth aspect includes the packaging substrate, the first semiconductor chip adhered to one surface of the packaging substrate, and the second semiconductor chip adhered to the opposite surface of the packaging substrate to the one surface of the packaging substrate, The packaging substrate has a plurality of through holes passing through the packaging substrate, and through-hole interconnects through which the power supply terminals are electrically connected to the switching elements are formed to fill the through holes. This allows the interconnects through which the power supply terminals are electrically connected to the switching elements to have substantially the same length. Therefore, the differences among the interconnects in resistance and capacitance are reduced. This can restrain the voltage supplied to each functional circuit and the timings at which power is supplied to the functional circuit and the power supply thereto is interrupted from varying. Furthermore, the degree of integration can be improved.

A semiconductor integrated circuit device according to a sixth aspect of the present invention includes: a plurality of functional circuits formed on a functional circuit region of a semiconductor chip and having power supply terminals, respectively; two first power supply circuits for supplying power through the power supply terminals to the functional circuits; two first power supply interruption circuits electrically connected between the two first power supply circuits and the power supply terminals and having a plurality of first switching elements for supplying power to the functional circuits or interrupting power supply thereto, the two first power supply circuits and the two first power supply interruption circuits being formed on opposed regions of the semiconductor chip with the functional circuit region of the semiconductor chip interposed between the opposed regions thereof; a power supply interruption control circuit for driving the two power supply interruption circuits in units of two of the plurality of first switching elements, said two of the plurality of first switching elements being included in the two first power supply interruption circuits, respectively, and connected to corresponding one of the plurality of power supply terminals; and a plurality of first power supply interconnects through which corresponding two of the first switching elements are electrically connected to each other and the corresponding two of the first switching elements are electrically connected to the associated one of the plurality of power supply terminals, the plurality of power supply interconnects having the same length.

The semiconductor integrated circuit device of the sixth aspect includes the plurality of first power supply interconnects through which the two first switching elements are electrically connected to each other and the two first switching elements are electrically connected to the one of the power supply terminals and which have the same length. Therefore, power can be supplied to the functional circuits under the same conditions. This can reduce the leakage current, resulting in reduced power consumption. Furthermore, the voltage supplied to each functional circuit and the timings at which power is supplied to the functional circuit and the power supply thereto is interrupted can be restrained from varying.

In this case, the semiconductor integrated circuit device of the sixth aspect may further include: two second power supply circuits for supplying power through the power supply terminals to the functional circuits; two second power supply interruption circuits having a plurality of second switching elements for supplying power to the functional circuits or interrupting power supply thereto, said two second power supply circuits and said two second power supply interruption circuits being formed on other opposed regions of the semiconductor chip than the opposed regions thereof on which the two first power supply circuits and the two first power supply interruption circuits are formed, the functional circuit region being interposed between said other opposed regions of the semiconductor chip; and a plurality of second power supply interconnects through which corresponding two of the second switching elements included in the two second power supply interruption circuits, respectively, and electrically connected to the corresponding one of the plurality of power supply terminals are electrically connected to each other and the corresponding two of the second switching elements are electrically connected to the corresponding one of the plurality of power supply terminals, said plurality of power supply interconnects crossing the first power supply interconnects and having the same length. The two of the first switching elements and the two of the second switching elements all electrically connected to the corresponding one of the power supply terminals are preferably driven together by the power supply interruption control circuit.

This structure allows power to be supplied from four directions. Therefore, power can be supplied to the functional circuits under the same conditions with reliability.

The first switching elements and the second switching elements are preferably logic circuits that are driven using a power supply voltage produced by the power supply circuit and the voltage of a drive signal produced by the power supply interruption control circuit as input signals.

In the semiconductor integrated circuit device of the present invention, the functional circuits preferably include a logic circuit and a memory circuit.

BRIEF DESCRIPTION OF THE DRAWINGS

FIGS. 2A and 2B illustrate a semiconductor integrated circuit device according to a second embodiment of the present invention, in which FIG. 2A is a plan view of the semiconductor integrated circuit device and FIG. 2B is a cross-sectional view taken along the line IIb-IIb in FIG. 2A.

FIGS. 3A and 3B illustrate a semiconductor integrated circuit device according to a third embodiment of the present invention, in which FIG. 3A is a plan view of the semiconductor integrated circuit device and FIG. 3B is a cross-sectional view taken along the line IIIb-IIIb in FIG. 3A.

FIGS. 5A and 5B illustrate a semiconductor integrated circuit device according to a fourth embodiment of the present invention, in which FIG. 5A is a plan view of the semiconductor integrated circuit device and FIG. 5B is a cross-sectional view taken along the line Vb-Vb in FIG. 5A.

DETAILED DESCRIPTION OF THE INVENTION

EMBODIMENT 1

Figure 1:
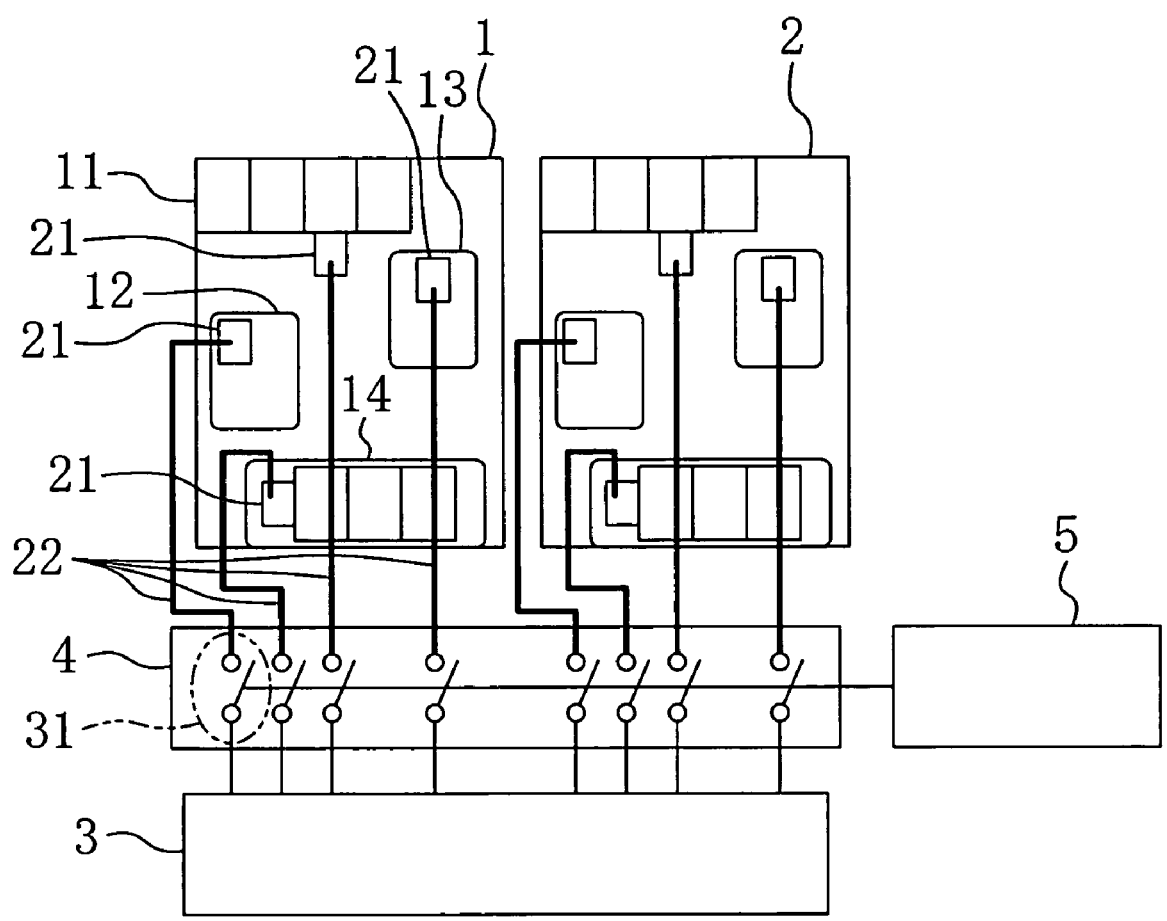
FIG. 1 is a plan view illustrating a semiconductor integrated circuit device according to a first embodiment of the present invention.

A first embodiment of the present invention will be described with reference to the drawings. FIG. 1 illustrates a plan structure of a semiconductor integrated circuit device according to the first embodiment.

As illustrated in FIG. 1, the semiconductor integrated circuit device of this embodiment is formed with functional circuit blocks 1 and 2, a power supply circuit 3 for supplying power to the functional circuit blocks 1 and 2, a power supply interruption circuit 4 disposed between a set of the functional circuit blocks 1 and 2 and the power supply circuit 3 and composed of a plurality of switching elements 31, and a circuit 5 for controlling the power supply interruption to individually drive the switching elements 31 (hereinafter, referred to as "power supply interruption control circuit 5").

The functional circuit block 1 is formed by integrating a first functional circuit 11, a second functional circuit 12, a third functional circuit 13, and a fourth functional circuit 14 all serving as functional circuits together. Each functional circuit is a circuit that performs a specific function, such as a memory circuit, a logic circuit, or a circuit obtained by combining a memory circuit and a logic circuit together.

A first functional circuit 11, a second functional circuit 12, a third functional circuit 13, and a fourth functional circuit 14 are provided with associated power supply terminals 21. Each of power supply interconnects 22 are electrically connected to associated one of the power supply terminals 21, and each power supply terminal 21 is electrically connected to one of terminals of associated one of switching elements 31 disposed in the power supply interruption circuit 4. The other terminal of the switching element 31 is electrically connected to the power supply circuit 3, and the switching elements 31 can individually switch between the ON position and the OFF position in response to the power supply interruption control circuit 5. This permits interruption of the power supply to some of the functional circuits that are not being used in the functional circuit block 1.

The power supply interconnects 22 are formed to have the same length between the power supply terminals 21 and the switching elements 31. This hardly causes variations among the power supply interconnects 22 in interconnect resistance and parasitic capacitance. This can suppress variations among the functional circuits in supply voltage and variations thereamong in the timings at which power is supplied to the functional circuits and the power supply thereto is interrupted.

As a result, variations among the functional circuits in timings at which power is supplied to the functional circuit and the power supply thereto is interrupted and variations thereamong in supply voltage can be suppressed, and the power supply to some of the functional circuits that are not in use can be interrupted. This can restrain the consumed power from increasing due to the production of leakage current.

The functional circuit block 2 has the same circuit configuration. It is possible to supply power to each functional circuit in units of functional circuits and interrupt the power supply thereto in units of the functional circuits.

The number of functional circuit blocks to be provided may be only one or three or more. Each functional circuit block may have different types and numbers of functional circuits.

EMBODIMENT 2

Figure 2A:
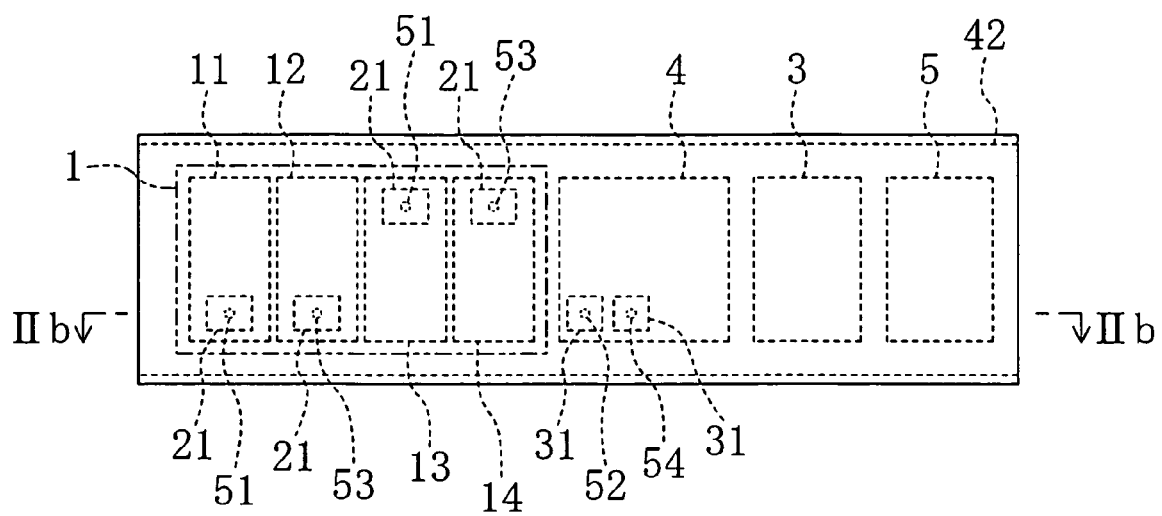
Figure 2B:
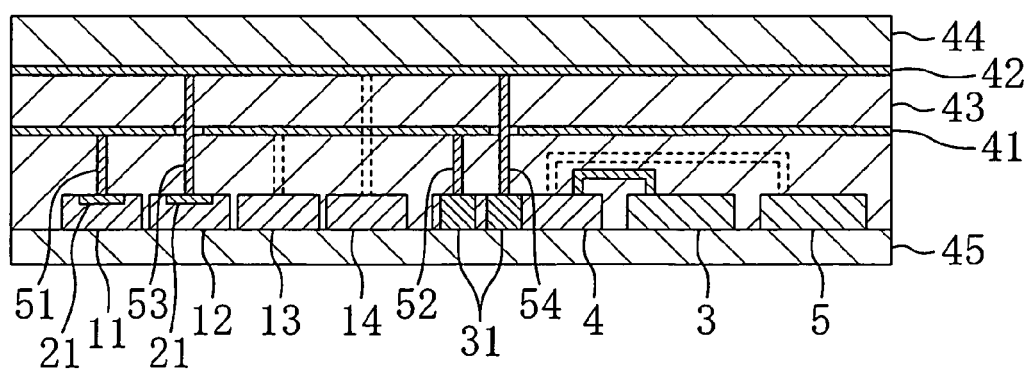

A second embodiment of the present invention will be described hereinafter with reference to the drawings. FIGS. 2A and 2B illustrate a semiconductor integrated circuit device according to the second embodiment. FIG. 2A is a plan view of the semiconductor integrated circuit device, and FIG. 2B is a cross-sectional view taken along the line IIb-IIb in FIG. 2A. In FIGS. 2A and 2B, the same reference numerals are given to the same components as those in FIG. 1, and thus a description thereof is not given.

As illustrated in FIGS. 2A and 2B, in the semiconductor integrated circuit device of this embodiment, power supply interconnects are three-dimensionally formed. A power supply interconnect layer 41 and a power supply interconnect layer 42 are formed at different levels above a functional circuit block 1 and a power supply interruption circuit 4 both formed on a substrate 45 of a semiconductor chip and composed of plate-like conductive films embedded in an interlayer dielectric 43 and an interlayer dielectric 44, respectively, and function as low-resistance interconnects each having a large surface area.

The power supply interconnect layer 41 is electrically connected through contact plugs 51 to respective power supply terminals 21 of a first functional circuit 11 and a third functional circuit 13 and electrically connected through a contact plug 52 to a power supply interruption circuit 4.

The power supply interconnect layer 42 is electrically connected through contact plugs 53 to respective power supply terminals 21 of a second functional circuit 12 and a fourth functional circuit 14 and electrically connected through a contact plug 54 to the power supply interruption circuit 4. The contact plugs 53 and the contact plug 54 are isolated from the power supply interconnect layer 41.

The contact plugs 52 and 54 are electrically connected to different switching elements 31 disposed in the power supply interruption circuit 4. Therefore, power can be separately supplied to the first functional circuit 11 and the third functional circuit 13, and the power supply thereto can be interrupted separately. Furthermore, power can be separately supplied to the second functional circuit 12 and the fourth functional circuit 14, and the power supply thereto can be interrupted separately.

In the semiconductor integrated circuit device of this embodiment, when the total length of interconnects between a power supply terminal 21 of a first functional circuit 11 and associated one of switching elements 31 of a power supply interruption circuit 4 is compared to that of interconnects between a power supply terminal 21 of a third functional circuit 13 and the associated one of the switching elements 31, there is a difference in length between part of the power supply interconnect layer 41 forming one of the interconnects between the power supply terminal 21 of the first functional circuit 11 and the associated one of the switching elements 31 and another part thereof forming one of the interconnects between the power supply terminal 21 of the third functional circuit 13 and the associated one of the switching elements 31. However, since the power supply interconnect layer 41 is a low-resistance flat interconnect, the difference in length between the parts of the power supply interconnect layer 41 hardly affects a voltage reduction and a delay in the timing at which power is supplied to the functional circuits. Hence, the total length of the interconnects between the power supply terminal 21 of the first functional circuit 11 and the associated one of switching elements 31 of the power supply interruption circuit 4 is substantially the same as that of the interconnects between the power supply terminal 21 of the third functional circuit 13 and the associated one of the switching elements 31. As a result, variations in the supply voltage and the timing at which power is supplied to the functional circuits are hardly caused between the first functional circuit 11 and the third functional circuit 13.

Likewise, the total length of interconnects between a power supply terminal 21 of a second functional circuit 12 and associated one of the switching elements 31 of a power supply interruption circuit 4 is substantially the same as that of interconnects between a power supply terminal 21 of a fourth functional circuit 14 and the associated one of the switching elements 31. Therefore, variations in the supply voltage and the timing at which power is supplied to the functional circuits are hardly caused also between the second functional circuit 12 and the fourth functional circuit 14. Furthermore, interconnects through which a power supply circuit 3 is electrically connected to the power supply terminals 21 are mostly formed of a low-resistance power interconnect layer 41 and a low-resistance power interconnect layer 42. This can reduce voltage drops between the power supply circuit 3 and the power supply terminals 21.

Although in this embodiment two power supply interconnect layers are provided, a necessary number of power supply interconnect layers may be provided according to the number of functional circuits that must be individually supplied with power and to which power must be individually interrupted. Like the first embodiment, a plurality of functional circuit blocks may be provided.

EMBODIMENT 3

Figure 3A:
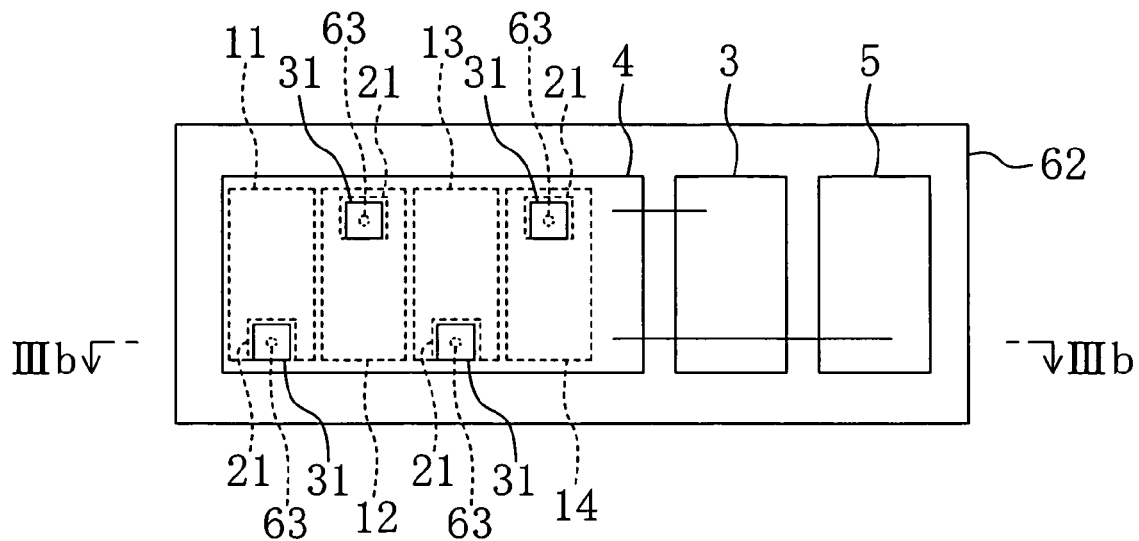
Figure 3B:
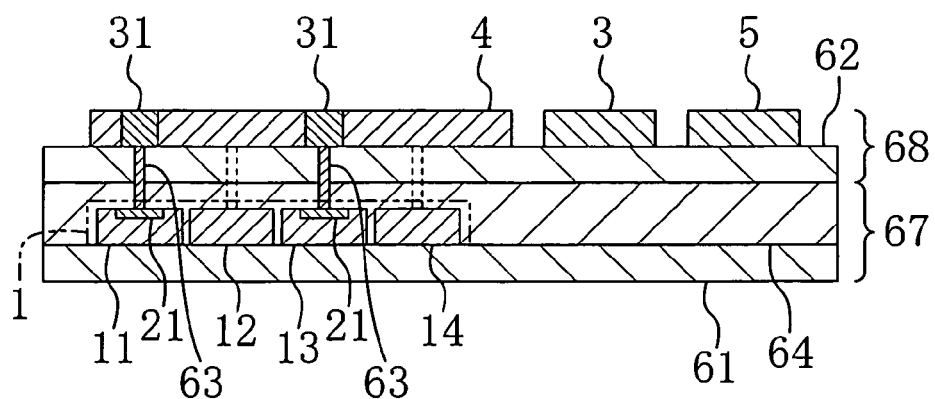

A third embodiment of the present invention will be described hereinafter with reference to the drawings. FIGS. 3A and 3B illustrate a semiconductor integrated circuit device according to the third embodiment. FIG. 3A illustrates a plan structure of the semiconductor integrated circuit device, and FIG. 3B illustrates a cross-sectional structure taken along the line IIIb-IIIb in FIG. 3A. In FIGS. 3A and 3B, the same reference numerals are given to the same components as those in FIG. 1, and a description thereof is not given.

As illustrated in FIGS. 3A and 3B, in the semiconductor integrated circuit device of this embodiment, a functional circuit block 1 composed of a plurality of functional circuits and a power supply interruption circuit 4 are formed on different semiconductor chips. A first semiconductor chip 67 is configured such that the functional circuit block 1 is formed on a surface of a first substrate 61 on which an element is to be formed. A second semiconductor chip 68 is configured such that the power supply interruption circuit 4 is formed on a surface of a second substrate 62 on which an element is to be formed. The second semiconductor chip 68 is bonded onto the first semiconductor chip 67 with an insulating film 64 interposed therebetween.

Power supply terminals 21 provided in a one-to-one correspondence with the functional circuits are electrically connected to associated switching elements 31 through through-hole interconnects 63 passing through the second substrate 62 and the insulating film 64.

According to the semiconductor integrated circuit device of this embodiment, power can be separately supplied to functional circuits included in the functional circuit block 1, and the power supply thereto can be interrupted separately. Therefore, the supply of power to some of the functional circuits that are not in use can be interrupted. This can restrain redundant power from being consumed due to leakage current.

The longest through-hole interconnects 63 out of interconnects between a power supply circuit 3 and the power supply terminals 21 can have the same length. This can prevent deterioration in controllability of the power supply, such as signal delays due to the differences in resistance and parasitic capacitance among interconnects and voltage drops due to interconnect resistance.

Furthermore, according to this embodiment, two semiconductor chips are bonded to each other and packaged. This can reduce the footprint as compared with the first embodiment and promote reduction in size of products equipped with semiconductor integrated circuit devices.

Figure 4A:
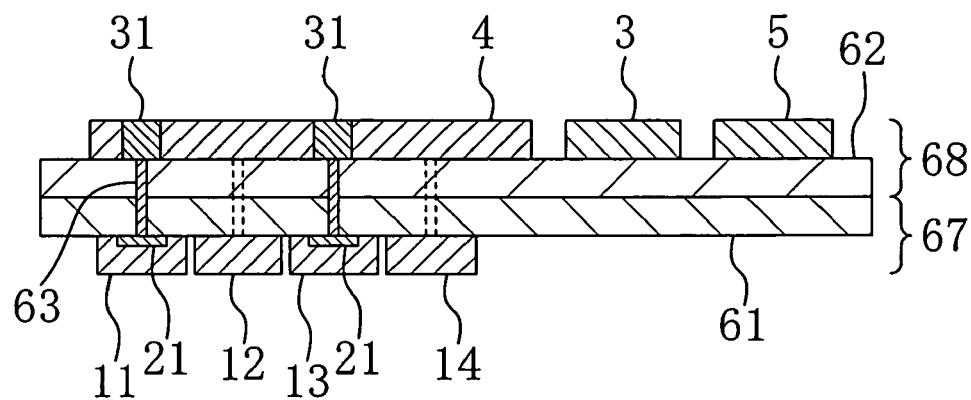
FIGS. 4A and 4B are cross-sectional views illustrating another exemplary semiconductor integrated circuit device according to the third embodiment of the present invention.

Although in this embodiment a second semiconductor chip 68 is bonded onto a first semiconductor chip 67, the first and second semiconductor chips 67 and 68 need only be three-dimensionally arranged, and therefore the first semiconductor chip 67 may be bonded onto the second semiconductor chip 68. Furthermore, as illustrated in FIG. 4A, the respective back surfaces of first and second semiconductor chips 67 and 68 may be bonded to each other. In this case, through-hole interconnects 63 need be formed to pass through first and second substrates 61 and 62.

Figure 4B:
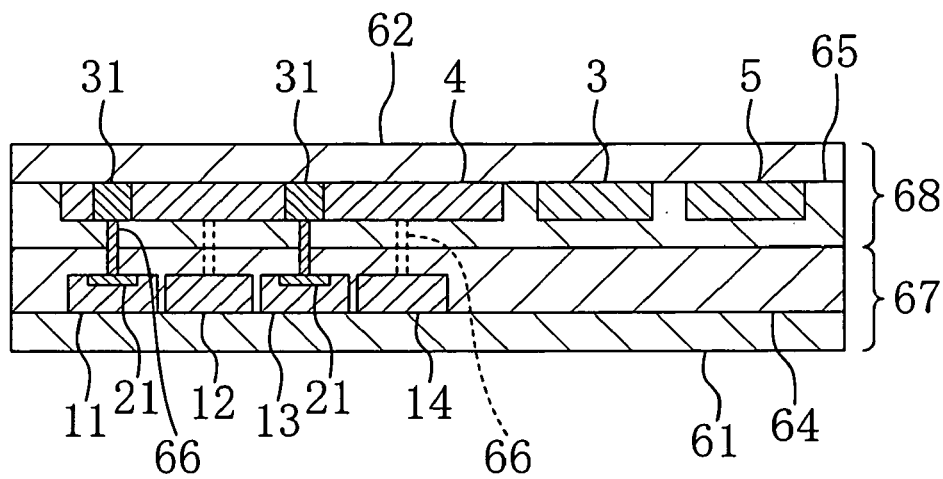

Moreover, as illustrated in FIG. 4B, a first semiconductor chip 67 may be bonded to a second semiconductor chip 68 with a functional circuit block 1 and a power supply interruption circuit 4 opposed to each other. In this case, switching elements 31 are electrically connected to associated power supply terminals 21 not through through-hole interconnects but through contact interconnects 66 passing through insulating films 64 and 65 formed, as respective parts of the first semiconductor chip 67 and the second semiconductor chip 68, between the first substrate 61 and the second substrate 62, respectively.

EMBODIMENT 4

A fourth embodiment of the present invention will be described hereinafter with reference to the drawings. FIGS. 5A and 5B illustrate a semiconductor integrated circuit device according to the fourth embodiment. FIG. 5A illustrates a plan structure of the semiconductor integrated circuit device, and FIG. 5B illustrates a cross-sectional structure taken along the line Vb-Vb in FIG. 5A. In FIGS. 5A and 5B, the same reference numerals are given to the same components as those in FIG. 1, and a description thereof is not given.

As illustrated in FIG. 5A and 5B, in the semiconductor integrated circuit device of this embodiment, a first semiconductor chip 72 and a second semiconductor chip 73 are mounted on one surface (top surface) of a packaging substrate 71. An LSI chip 74 for control of power (hereinafter, referred to as "power control LSI chip 74") is mounted on the other surface (back surface) of the packaging substrate 71.

The first semiconductor chip 72 includes a functional circuit block 1. The functional circuit block 1 is formed of a first functional circuit 11, a second functional circuit 12, a third functional circuit 13, and a fourth functional circuit 14 all serving as functional circuits. The functional circuits are formed with associated power supply terminals 21 which are in the form of area pads.

The power control LSI chip 74 is formed of a power supply circuit 3 for supplying power to the first and second semiconductor chips 72 and 73, a power supply interruption circuit 4 for supplying power thereto and interrupting the power supply thereto, and a power supply interruption control circuit 5 for driving the power supply interruption circuit 4.

The power supply terminals 21 of the functional circuits are connected to associated switching elements 31 serving as switches provided in the power supply interruption circuit 4, and the switching elements 31 can individually open or close. Therefore, power can be separately supplied to the functional circuits, and the power supply to the functional circuits can be interrupted separately.

The power terminals 21 are electrically connected to the associated switching elements 31 through through-hole interconnects 75 formed in through holes passing through the packaging substrate 71. Therefore, interconnects through which the power supply terminals 21 are connected to the switching elements 31 have substantially the same length. This allows interconnects through which the power supply circuit 3 is connected to the power supply terminals 21 to have substantially the same length. This hardly causes the differences among the interconnects in resistance and parasitic capacitance. This can suppress variations among the functional circuits in supply voltage and variations among the functional circuits in the timings at which power is supplied to the functional circuits and the power supply thereto is interrupted.

Furthermore, according to this embodiment, semiconductor chips are bonded to each other and packaged by utilizing the top and back surfaces of a packaging substrate. The packaging densities of semiconductor integrated circuit devices can be increased. This can promote reduction in size of products equipped with semiconductor integrated circuit devices.

EMBODIMENT 5

Figure 6:
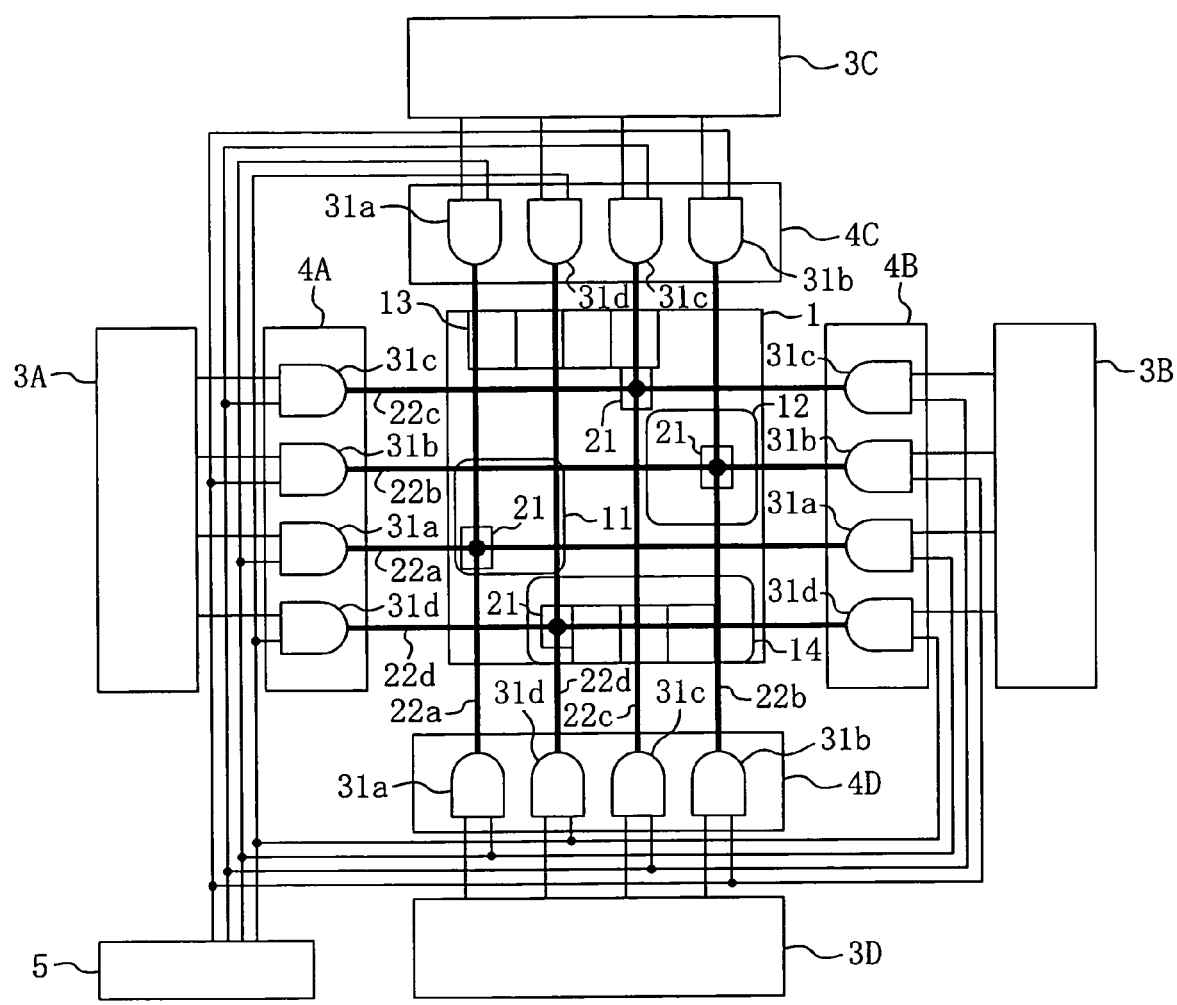
FIG. 6 is a plan view illustrating a semiconductor integrated circuit device according to a fifth embodiment of the present invention.

A fifth embodiment of the present invention will be described hereinafter with reference to the drawings. FIG. 6 illustrates a plan structure of a semiconductor integrated circuit device according to the fifth embodiment. In FIG. 6, the same reference numerals are given to the same components as those in FIG. 1, and a description thereof is not given.

As illustrated in FIG. 6, the semiconductor integrated circuit device of this embodiment includes a functional circuit block 1, four power supply circuits 3 (3A through 3D), and four power supply interruption circuits 4 (4A through 4D) that are all formed on a semiconductor chip. The four power supply circuits 3 (3A through 3D), and four power supply interruption circuits 4 (4A through 4D) are provided around the functional circuit block 1.

In this embodiment, each of the power supply interruption circuits 4 include associated one of first switching elements 31a, associated one of second switching elements 31b, associated one of third switching elements 31c, and associated one of fourth switching elements 31d. Two of the power supply interruption circuit 4 provided on a semiconductor chip are opposed to each other with the functional circuit block 1 interposed therebetween and the other two thereof are also opposed to each other with the functional circuit block 1 interposed therebetween. Each of two power supply interconnects 22a, each of two power supply interconnects 22b, each of two power supply interconnects 22c, and each of two power supply interconnects 22d electrically connects associated ones of the first switching elements 31a, associated ones of the second switching elements 31b, associated ones of the third switching elements 31c, and associated ones of the fourth switching elements 31d, respectively.

A power supply terminal 21 of a functional circuit 11 is electrically connected to the intersection of the two power supply interconnects 22a. A power supply terminal 21 of a second functional circuit 12, a power supply terminal 21 of a third functional circuit 13, and a power supply terminal 21 of a fourth functional circuit 14 are also electrically connected to the intersection of the two power supply interconnects 22b, the intersection of the two power supply interconnects 22c, and the intersection of the two power supply interconnects 22d, respectively.

The first switching elements 31a, the second switching elements 31b, the third switching elements 31c, and the fourth switching elements 31d are individually driven. Therefore, power can be supplied to the functional circuits in units of the functional circuits and the power supply to the functional circuits can be interrupted in units of the functional circuits.

The first switching elements 31a included in the power supply interruption circuits 4A, 4B, 4C, and 4D, respectively, are driven as a single unit, the second switching elements 31b included therein are also driven as a single unit, the third switching elements 31c included therein are also driven as a single unit, and the fourth switching elements 31d included therein are also driven as a single unit.

In the semiconductor integrated circuit device of this embodiment, the total resistance of interconnects between power supplies and power supply terminals is equal to the resistance obtained when interconnect resistors between the power supply circuit 3A and the corresponding power supply terminal 21, between the power supply circuit 3B and the corresponding power supply terminal 21, between the power supply circuit 3C and the corresponding power supply terminal 21, and between the power supply circuit 3D and the corresponding power supply terminal 21 are connected in parallel.

In view of the above, when power supply terminals are formed in any region of a functional circuit block 1, the total resistance of interconnects between power supplies and power supply terminals is generally fixed. Therefore, power can be supplied to functional circuits under substantially the same conditions. This can suppress variations among the functional circuits in voltage supplied to the functional circuits.

In this embodiment, switching elements 31 are formed of logic circuits. The output of each power supply circuit 3 is connected to one of inputs of each logic circuit, and the output of a power supply interruption control circuit 5 is connected to the other input of the logic circuit. Therefore, four of the switching elements 31 included in four power supply interruption circuits, respectively, can be easily driven as a single unit.

As described above, the semiconductor integrated circuit device of the present invention is effective at suppressing variations in timings at which power is supplied to functional circuits and at which the power supply thereto is interrupted and variations in voltage supplied thereto and reducing the power consumed due to leakage current in units of the functional circuits and useful for semiconductor integrated circuit devices or the like.

What is claimed is:

1. A semiconductor integrated circuit device comprising:
a plurality of functional circuits formed on a semiconductor chip and having power supply terminals, respectively;
a power supply circuit for supplying power through the power supply terminals to the functional circuits;
a power supply interruption circuit electrically connected between the power supply circuit and the power supply terminals and having a plurality of switching elements for supplying power to the functional circuits or interrupting power supply thereto; and
a plurality of interconnects through which the power supply terminals are electrically connected to the switching elements, respectively, the plurality of interconnects having the same length.

2. The semiconductor integrated circuit device of claim 1, wherein the functional circuits include a logic circuit and a memory circuit.

* * * * *

UNITED STATES PATENT AND TRADEMARK OFFICE
CERTIFICATE OF CORRECTION

PATENT NO. : 7,626,266 B2 Page 1 of 1
APPLICATION NO. : 11/475184
DATED : December 1, 2009
INVENTOR(S) : Kenichi Tajika It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 514 days.

Signed and Sealed this

Second Day of November, 2010

David J. Kappos
*Director of the United States Patent and Trademark Office*